(12) United States Patent
Chang et al.

(10) Patent No.: US 10,978,357 B2
(45) Date of Patent: Apr. 13, 2021

(54) SEMICONDUCTOR ARRANGEMENT AND METHOD OF MANUFACTURE

(71) Applicant: TAIWAN SEMICONDUCTOR MANUFACTURING COMPANY LIMITED, Hsin-Chu (TW)

(72) Inventors: I-Ming Chang, ShinChu (TW); Chung-Liang Cheng, Changhua County (TW); Hsiang-Pi Chang, New Taipei (TW); Hsueh Wen Tsau, Zhunan Township (TW); Ziwei Fang, Hsinchu (TW)

(73) Assignee: Taiwan Semiconductor Manufacturing Company Limited, Hsin-Chu (TW)

( * ) Notice: Subject to any disclaimer, the term of this patent is extended or adjusted under 35 U.S.C. 154(b) by 0 days.

(21) Appl. No.: 16/433,376

(22) Filed: Jun. 6, 2019

(65) Prior Publication Data

US 2020/0176328 A1 Jun. 4, 2020

Related U.S. Application Data

(60) Provisional application No. 62/773,301, filed on Nov. 30, 2018.

(51) Int. Cl.
| | | |
|---|---|---|
| *H01L 21/8238* | (2006.01) | |
| *H01L 29/66* | (2006.01) | |
| *H01L 21/225* | (2006.01) | |
| *H01L 21/306* | (2006.01) | |
| *H01L 21/223* | (2006.01) | |
| *H01L 29/06* | (2006.01) | |
| *H01L 29/423* | (2006.01) | |
| *H01L 21/762* | (2006.01) | |

(52) U.S. Cl.
CPC .. *H01L 21/823821* (2013.01); *H01L 21/2236* (2013.01); *H01L 21/2256* (2013.01); *H01L 21/30604* (2013.01); *H01L 21/823828* (2013.01); *H01L 21/823864* (2013.01); *H01L 29/0673* (2013.01); *H01L 29/42392* (2013.01); *H01L 29/66545* (2013.01); *H01L 21/76224* (2013.01); *H01L 21/823878* (2013.01)

(58) Field of Classification Search
CPC ....... H01L 21/823821; H01L 29/66545; H01L 21/823864; H01L 21/2256; H01L 21/30604; H01L 21/2236; H01L 29/0673; H01L 29/42392; H01L 21/823828; H01L 21/76224; H01L 21/823878; H01L 29/78696; H01L 21/2255; H01L 29/401; H01L 29/775; H01L 29/66439; B82Y 10/00

See application file for complete search history.

(56) References Cited

U.S. PATENT DOCUMENTS

| | | | |
|---|---|---|---|
| 2017/0200656 A1* | 7/2017 | Li | ............... H01L 21/82382 |
| 2019/0035923 A1* | 1/2019 | Sadana | ............... H01L 29/785 |
| 2020/0211901 A1* | 7/2020 | Clendenning | ..... H01L 29/66795 |

* cited by examiner

*Primary Examiner* — Mohammed R Alam
(74) *Attorney, Agent, or Firm* — Slater Matsil, LLP

(57) ABSTRACT

A method for forming a semiconductor arrangement includes forming a fin. A diffusion process is performed to diffuse a first dopant into the channel region of the fin. A first gate electrode is formed over the channel region of the fin after the first dopant is diffused into the channel region of the fin.

20 Claims, 17 Drawing Sheets

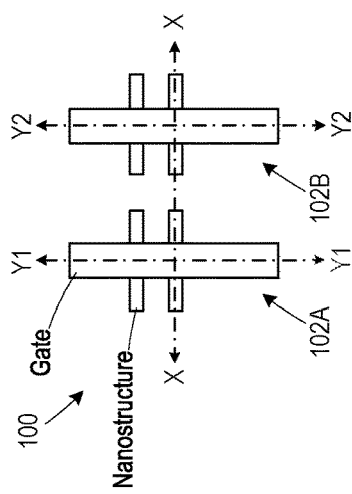
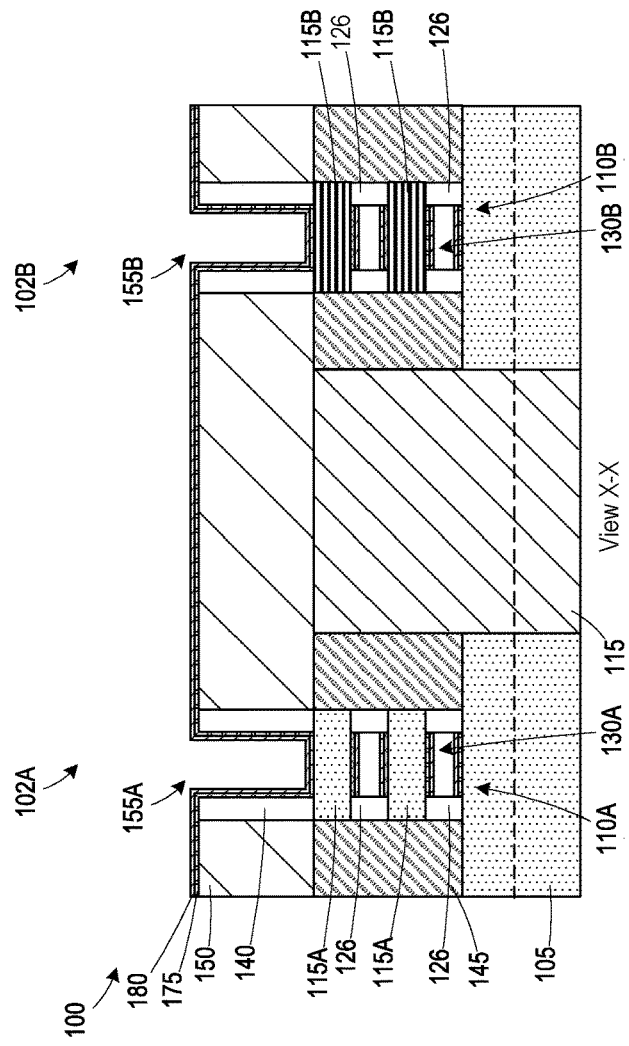
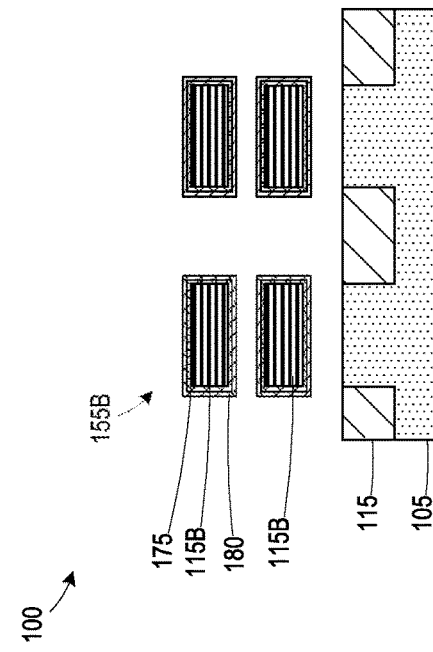
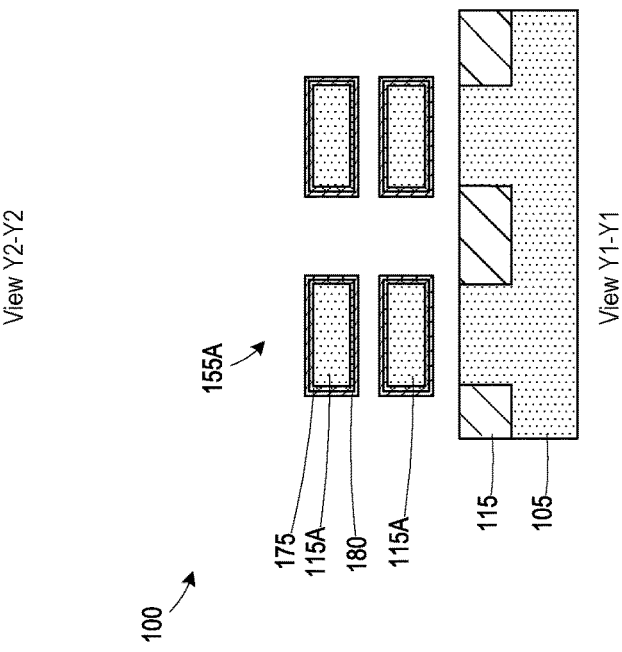
Figure 8A

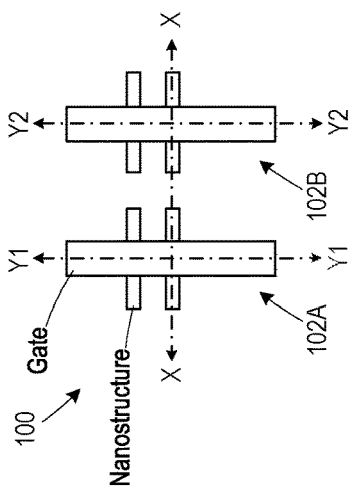
Figure 8B
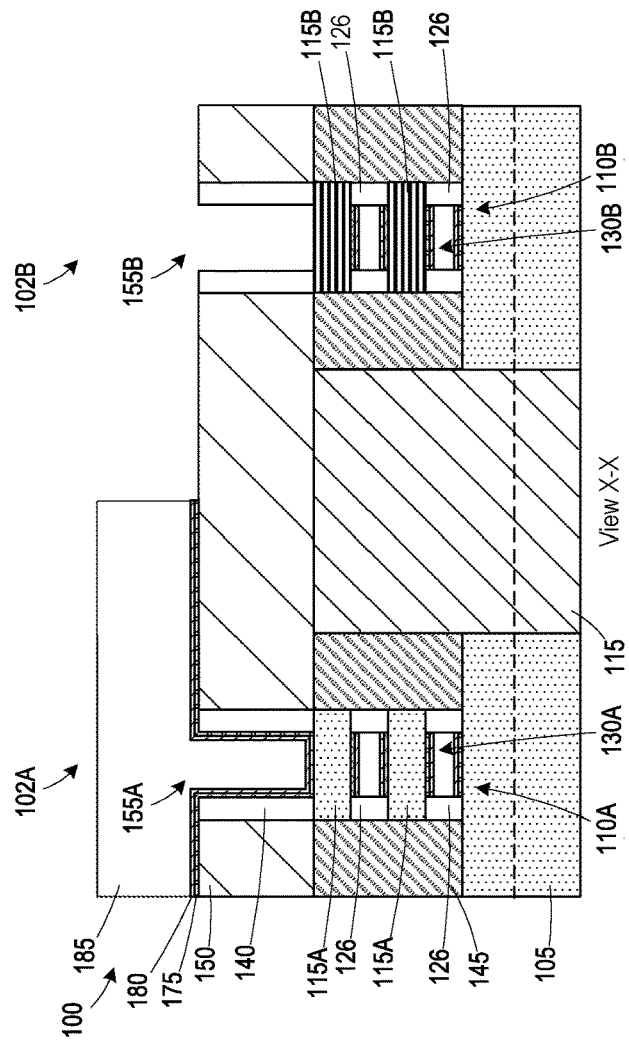
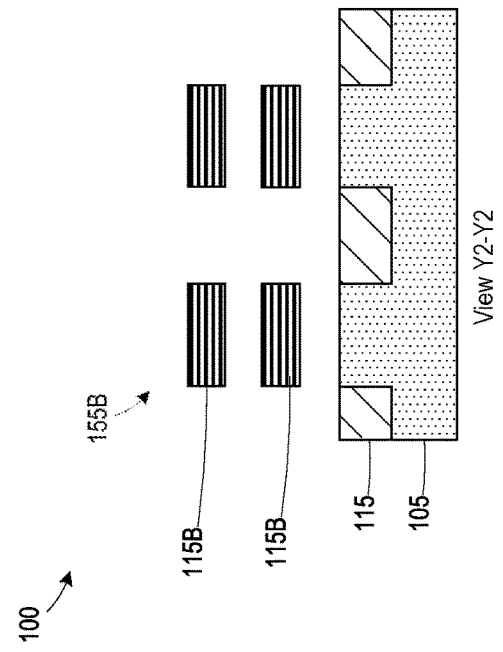
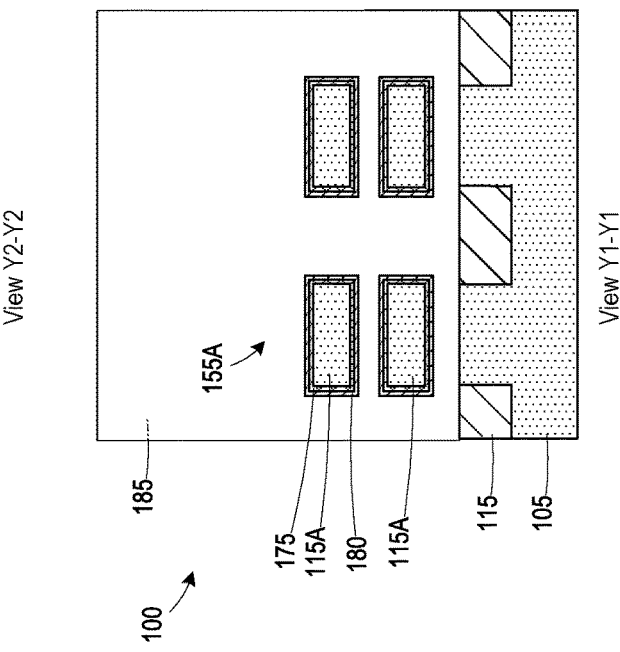

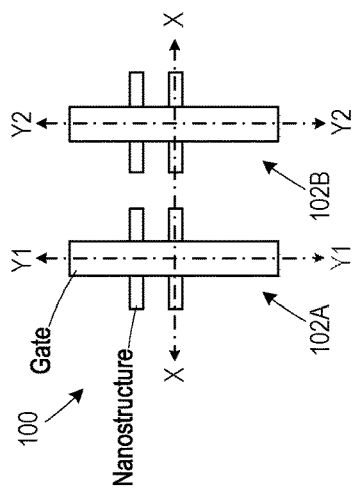
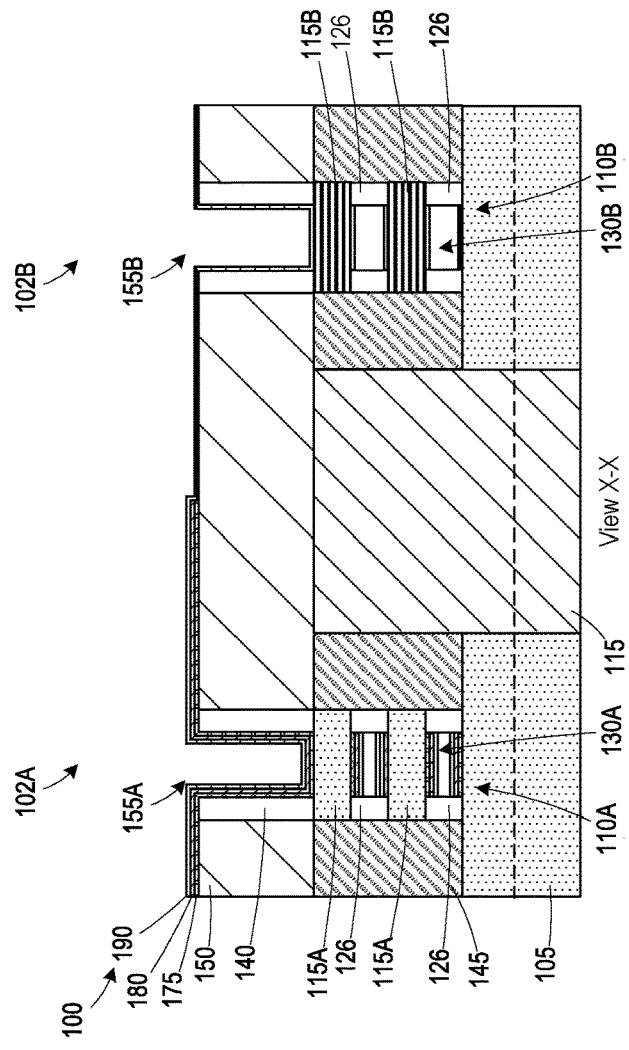
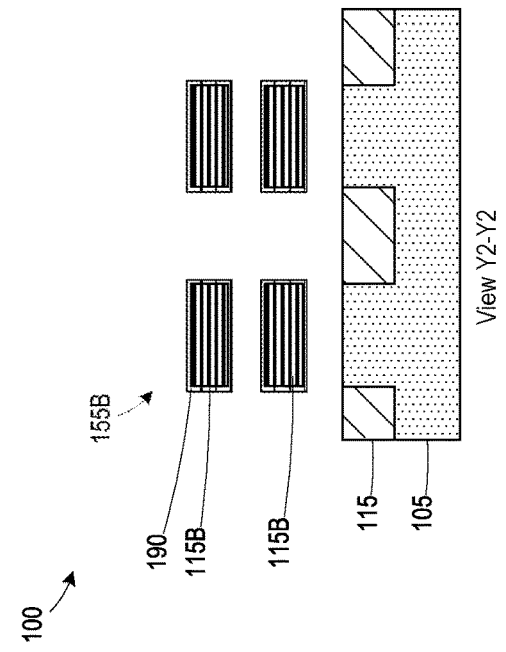
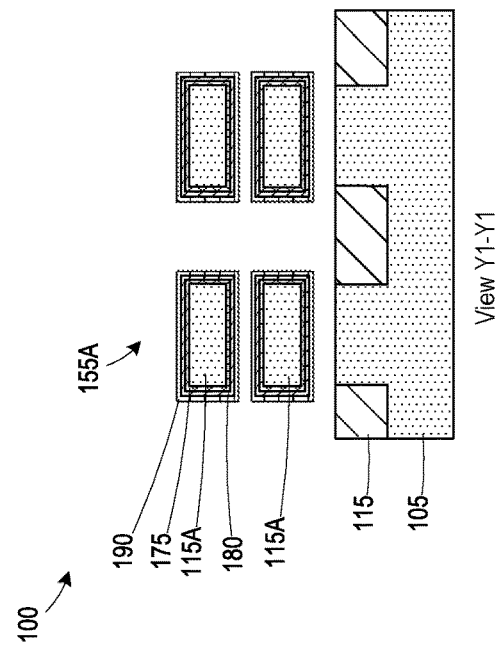
Figure 8C

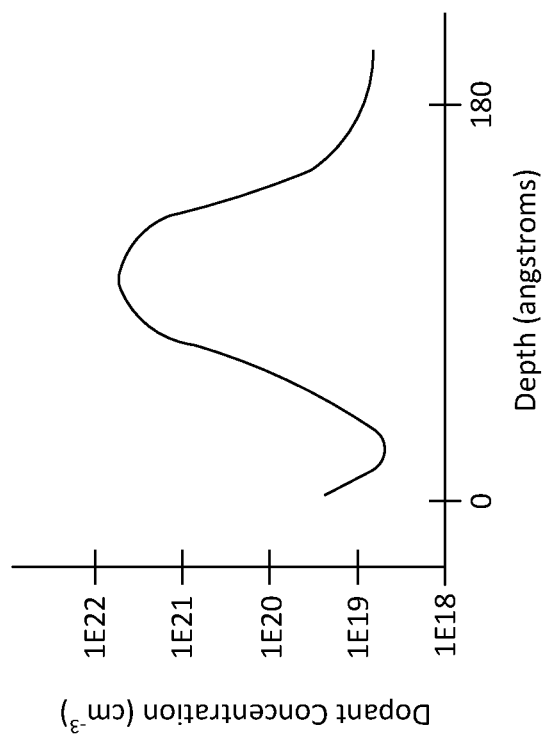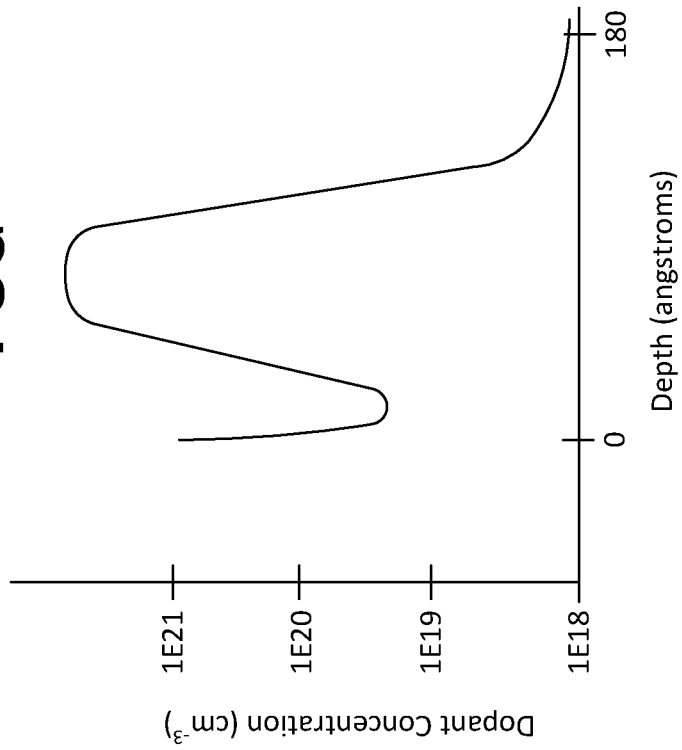
Figure 8E

SEMICONDUCTOR ARRANGEMENT AND METHOD OF MANUFACTURE

RELATED APPLICATION

This application claims priority to U.S. Provisional Application Ser. No. 62/773,301, titled "SEMICONDUCTOR ARRANGEMENT AND METHOD OF MANUFACTURE" and filed on Nov. 30, 2018, which is incorporated herein by reference.

BACKGROUND

As the semiconductor industry has progressed into nanometer technology process nodes in pursuit of higher device density, higher performance, and lower costs, challenges from both fabrication and design issues have resulted in the development of three dimensional designs, such as gate all around (GAA) transistors. A GAA transistor comprises one or more nano-sheet or nano-wire channel regions having a gate wrapped around the nano-sheet or nano-wire. GAA transistors can reduce the short channel effect.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1-7, and 8A-8D are illustrations of a semiconductor arrangement at various stages of fabrication, in accordance with some embodiments.

FIGS. 8E and 8F are curves illustrating dopant concentrations prior to and after a solid phase diffusion process, in accordance with some embodiments.

DETAILED DESCRIPTION

Figure 1:
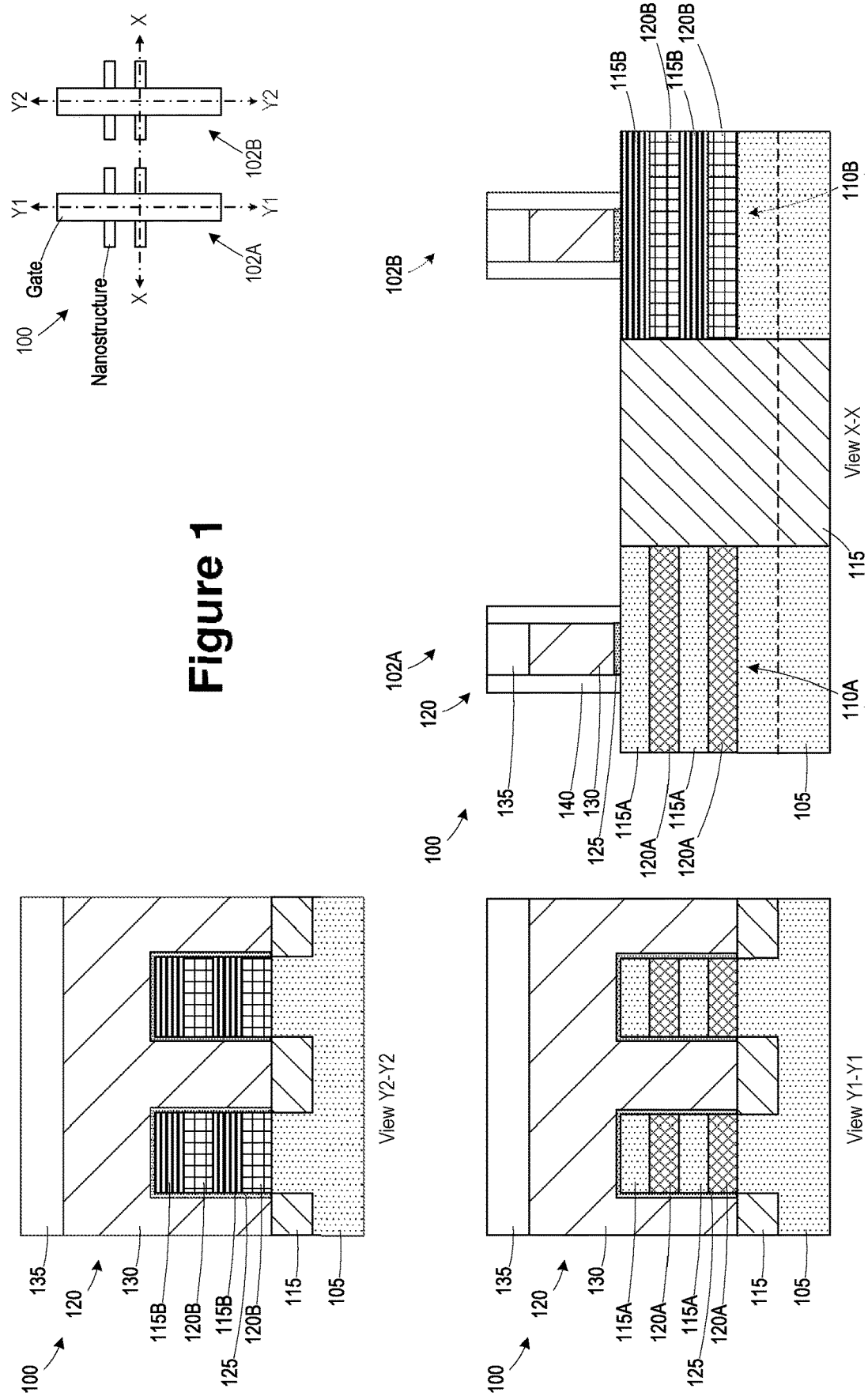

The following disclosure provides many different embodiments, or examples, for implementing different features of the provided subject matter. Specific examples of components and arrangements are described below to simplify the present disclosure. These are, of course, merely examples and are not intended limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

One or more techniques for fabricating a semiconductor arrangement are provided herein. In some embodiments, the semiconductor arrangement comprises a nano-structure transistor, such as a nano-sheet transistor or nano-wire transistor, having a single nano-structure, such as a single nano-sheet or nano-wire, or multiple nano-structures on the semiconductor layer. In some embodiments, doped regions are formed on channel regions of the nano-structure using diffusion processes. In some embodiments, a doped layer is formed above the channel regions and an anneal process is performed to diffuse dopants into the channel regions. In some embodiments, a plasma assisted diffusion process is performed to diffuse dopants into the channel regions. In some embodiments, different dopants are provided for n-type transistors and p-type transistors.

FIGS. 1-7, 8A-8D, 9A-9B, 10, and 11 are illustrations of a semiconductor arrangement 100 at various stages of fabrication, in accordance with some embodiments. FIGS. 1-7, 8A-8D, 9A-9B, 10, and 11 include a simplistic plan view showing where various cross-sectional views are taken. Referring to FIG. 1, the view X-X is a cross-sectional view taken through the semiconductor arrangement 100 in a direction corresponding to a gate fin length direction through fins formed in different regions, and the views Y1-Y1 and Y2-Y2 are cross-sectional views taken through the semiconductor arrangement 100 in a direction corresponding to a gate length direction through gate structures. Not all aspects of the processing shown in the cross-sectional views will be depicted in the plan view. In some embodiments, the devices shown in view Y1-Y1 are formed in a first region 102A of the semiconductor arrangement 100, and the devices shown in view Y2-Y2 are formed in a second region 102B of the semiconductor arrangement 100. In some embodiments, the first region 102A comprises devices having a first dopant type, and the second region 102B comprises devices having a second dopant type different that the first dopant type.

Referring to FIG. 1, a plurality of layers used in the formation of the semiconductor arrangement 100 are illustrated, in accordance with some embodiments. The plurality of layers is formed over a semiconductor layer 105. In some embodiments, the semiconductor layer 105 is part of a substrate comprising at least one of an epitaxial layer, a single crystalline semiconductor material such as, but not limited to Si, Ge, SiGe, InGaAs, GaAs, InSb, GaP, GaSb, InAlAs, GaSbP, GaAsSb, and InP, a silicon-on-insulator (SOI) structure, a wafer, or a die formed from a wafer. In some embodiments, the semiconductor layer 105 comprises crystalline silicon.

In some embodiments, the semiconductor arrangement 100 comprises nano-structure based transistors. Nano-structure is used herein to refer to substantially flat, nearly two-dimensional structures, such as sometimes referred to as nano-sheets, as well as structures having two-dimensions that are similar in magnitude, such as sometimes referred to as nano-wires.

In some embodiments, fins 110A, 110B are formed by forming a stack of semiconductor material layers and performing an etch process to remove some of the stack of semiconductor material layers, thereby defining the fins 110A, 100B. In some embodiments, the fins 110A, 110B comprises semiconductor material layers 115A, 115B and sacrificial semiconductor layers 120A, 120B. In some embodiments, the materials of the semiconductor material layers 115A, 115B are different than the materials of the sacrificial semiconductor layers 120A, 120B to provide etch selectivity and allow removal of the sacrificial semiconductor layers 120A, 120B.

In some embodiments, the semiconductor material layers 115A, 115B comprise the same material composition and the sacrificial semiconductor layers 120A, 120B comprise the same material composition. In some embodiments, the semiconductor material layers 115A, 115B comprise substantially pure silicon, and the sacrificial semiconductor layers 120A, 120B comprise silicon-germanium ($Si_xGe_{(1-x)}$ where x ranges from 0.25 to 0.85).

In some embodiments, the semiconductor material layers 115A, 115B are different materials and the sacrificial semiconductor layers 120A, 120B are different materials. In some embodiments, the semiconductor material layers 115A comprise substantially pure silicon, and the semiconductor material layers 115B comprise silicon-germanium ($Si_xGe_{(1-x)}$, where x ranges from 0.25 to 0.85). In some embodiments, the sacrificial semiconductor layers 120A, 120B comprise different alloy concentrations of Ge to provide etch selectivity with respect to the semiconductor material layers 115A, 115B.

In some embodiments, the number of semiconductor material layers 115A, 115B and sacrificial semiconductor layers 120A, 120B is more than two. In some embodiments, the order of the semiconductor material layers 115A, 115B and sacrificial semiconductor layers 120A, 120B vary. In some embodiments, thicknesses of the semiconductor material layers 115A, 115B and sacrificial semiconductor layers 120A, 120B vary, and the thicknesses need not be the same.

In some embodiments, during the etch process to remove some of the stack of semiconductor material layers or during a subsequent etch process, a portion of the semiconductor layer 105 is etched to define a recess between the fins 110A, 110B. In some embodiments, an isolation structure 115, such as shallow trench isolation (STI), is formed in the recess. In some embodiments, the isolation structure 115 is formed by depositing a dielectric layer between the fins 110A, 110B and recessing the dielectric layer to expose at least portions of the sidewalls of the fins 110A, 110B. In some embodiments, the isolation structure 115 comprises silicon and oxygen or other suitable dielectric materials.

In some embodiments, sacrificial gate structures 120 are formed over the fins 110A, 110B and over the isolation structure 115. In some embodiments, the sacrificial gate structures 120 comprise a first gate dielectric layer 125 and sacrificial gate electrodes 130. In some embodiments, the first gate dielectric layer 125 comprises a high-k dielectric material. As used herein, the term "high-k dielectric" refers to the material having a dielectric constant, k, greater than or equal to about 3.9, which is the k value of $SiO_2$. The material of the high-k dielectric layer may be any suitable material. Examples of the material of the high-k dielectric layer include but are not limited to $Al_2O_3$, $HfO_2$, $ZrO_2$, $La_2O_3$, $TiO_2$, $SrTiO_3$, $LaAlO_3$, $Y_2O_3$, $Al_2O_xN_y$, $HfO_xN_y$, $ZrO_xN_y$, $La_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3, and each value of y is independently from 0 to 2.

In some embodiments, the first gate dielectric layer 125 comprises a native oxide layer formed by exposure of the semiconductor arrangement 100 to oxygen at various points in the process flow, causing the formation of silicon dioxide on exposed surfaces of the fins 110A, 110B. In some embodiments, an additional layer of dielectric material, such as a high-k dielectric material or other suitable material, is formed over the native oxide to form the first gate dielectric layer 125. According to some embodiments, the sacrificial gate structures 120 are formed by forming a layer of sacrificial material and a hard mask layer over the fins 110A, 110B and the isolation structure 115. In some embodiments, a patterning process is performed to pattern the hard mask layer corresponding to the pattern of gate structures to be formed, and an etch process is performed using the patterned hard mask layer to etch the sacrificial layer to define the sacrificial gate electrodes 130. In some embodiments, remaining portions of the hard mask layer form cap layers 135 over the sacrificial gate electrodes 130.

In some embodiments, sidewall spacers 140 are formed adjacent the sacrificial gate structures 120. In some embodiments, the sidewall spacers 140 are formed by depositing a conformal spacer layer over the sacrificial gate structures 120 and performing an anisotropic etch process to remove portions of the spacer layer positioned on horizontal surfaces of the cap layers 135, the fins 110A, 110B, and the isolation structure 115. In some embodiments, the sidewall spacers 140 comprise the same material composition as the cap layer 135. In some embodiments, the sidewall spacers 140 comprises nitrogen and silicon or other suitable materials.

Figure 2:
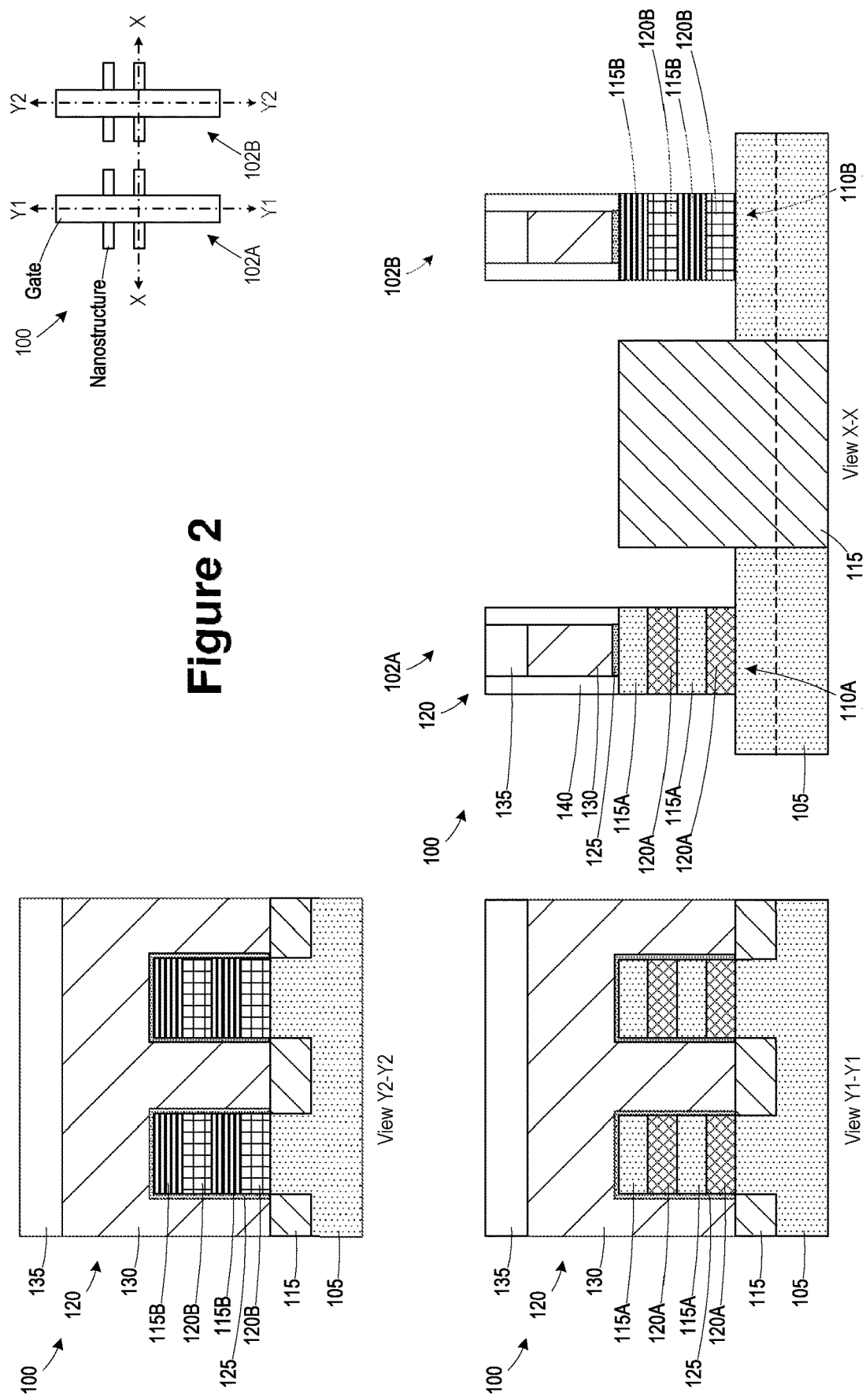

Referring to FIG. 2, the semiconductor material layers 115A, 115B and the sacrificial semiconductor layers 120A, 120B are etched using the sidewall spacers 140 and the sacrificial gate structures 120 as an etch mask, in accordance with some embodiments. In some embodiments, the semiconductor layer 105 is exposed during an etch process used to etch the semiconductor material layers 115A, 115B and the sacrificial semiconductor layers 120A, 120B.

Figure 3:
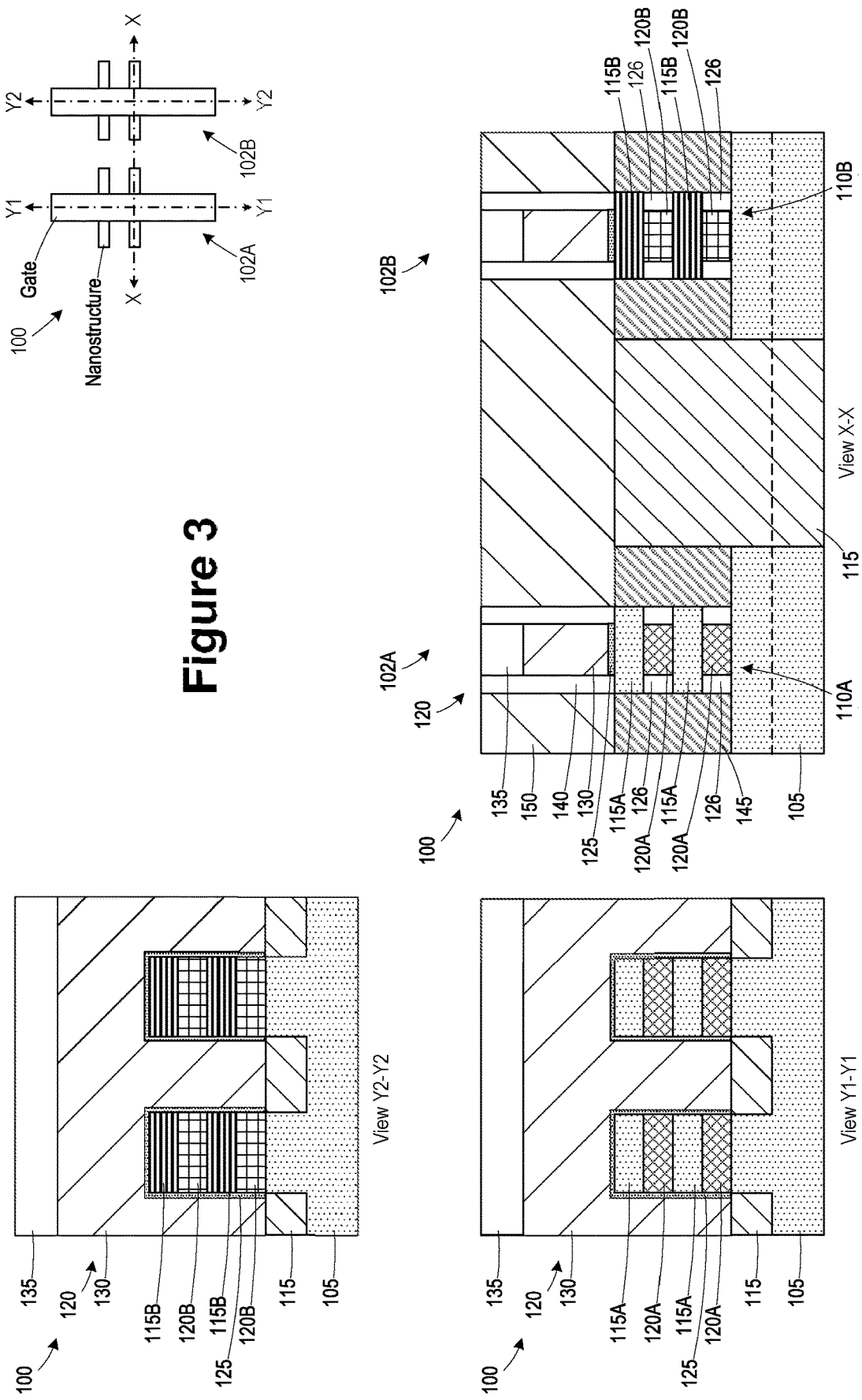

Referring to FIG. 3, end spacers 126 are formed adjacent ends of the sacrificial semiconductor layers 120A, 120B, source/drain regions 145 are formed in the fins 110A, 110B, and a dielectric layer 150 is formed over the fins 110A, 110B and adjacent the sacrificial gate structures 120, in accordance with some embodiments. In some embodiments, after forming the fins 110A, 110B, an isotropic etch process is performed to recess the sacrificial semiconductor layers 120A, 120B to define end cavities. In some embodiments, a deposition process is performed to form a dielectric spacer layer over the fins 110A, 110B and an isotropic etch process is performed to remove portions of the dielectric spacer layer outside the end cavities to define the end spacers 126. In some embodiments, the end spacers 126 comprise the same material composition as the sidewall spacers 140.

In some embodiments, the source/drain regions 145 are formed in the fins 110A, 110B after forming the sacrificial gate structures 120 and after forming the end spacers 126. In some embodiments, an epitaxial growth process is performed to form the source/drain regions 145.

In some embodiments, the dielectric layer 150 is formed over the fins 110A, 110B and adjacent the sacrificial gate structures 120 after forming the source/drain regions 145. In some embodiments, a portion of the dielectric layer 150 is removed to expose the cap layers 135. In some embodiments, the dielectric layer 150 is planarized to expose the cap layers 135. In some embodiments, the dielectric layer 150 comprises silicon dioxide or a low-k material. In some embodiments, the dielectric layer 150 comprises one or more layers of low-k dielectric material. The materials for the dielectric layer 150 comprise at least one of Si, O, C, or H, such as SiCOH and SiOC, or other suitable materials. Organic material such as polymers may be used for the he dielectric layer 150. In some embodiments, the dielectric layer 150 comprises one or more layers of a carbon-containing material, organo-silicate glass, a porogen-containing material, or combinations thereof. The dielectric layer 150 may also comprise Nitrogen in some embodiments. The dielectric layer 150 may be formed by using, for example, at least one of low pressure CVD (LPCVD), atomic layer CVD (ALCVD), or a spin-on technology.

Figure 4:
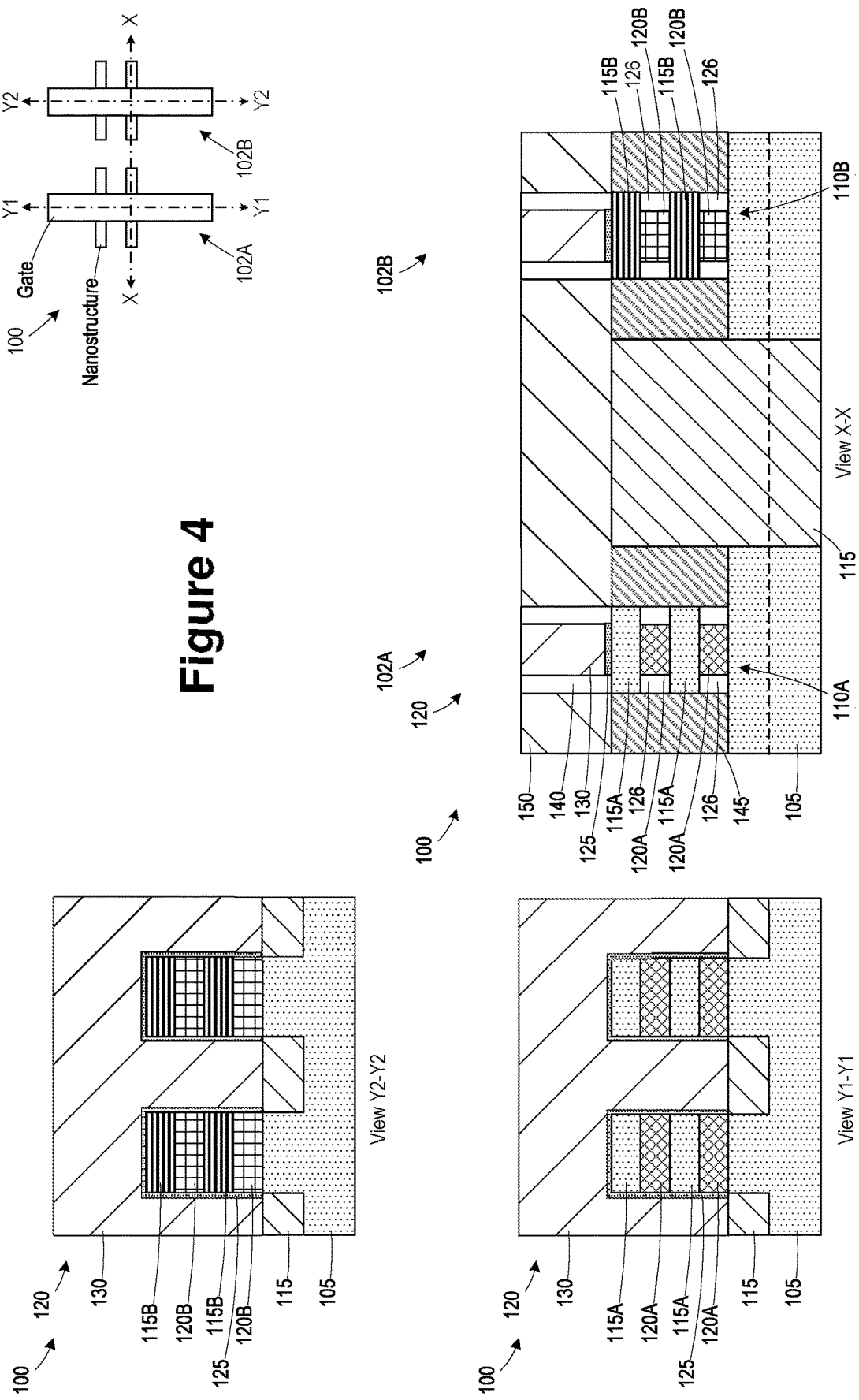

Referring to FIG. 4, the cap layers 135 are removed and heights of the sidewall spacers 140 and the dielectric layer 150 are reduced, in accordance with some embodiments. In some embodiments, a planarization process is performed to remove the cap layers 135 and to reduce the heights of the sidewall spacers 140 and the dielectric layer 150. In some embodiments, the planarization process exposes the sacrificial gate electrodes 130. In some embodiments, the planarization process is a continuation of the process performed to planarize the dielectric layer 150.

Figure 5:
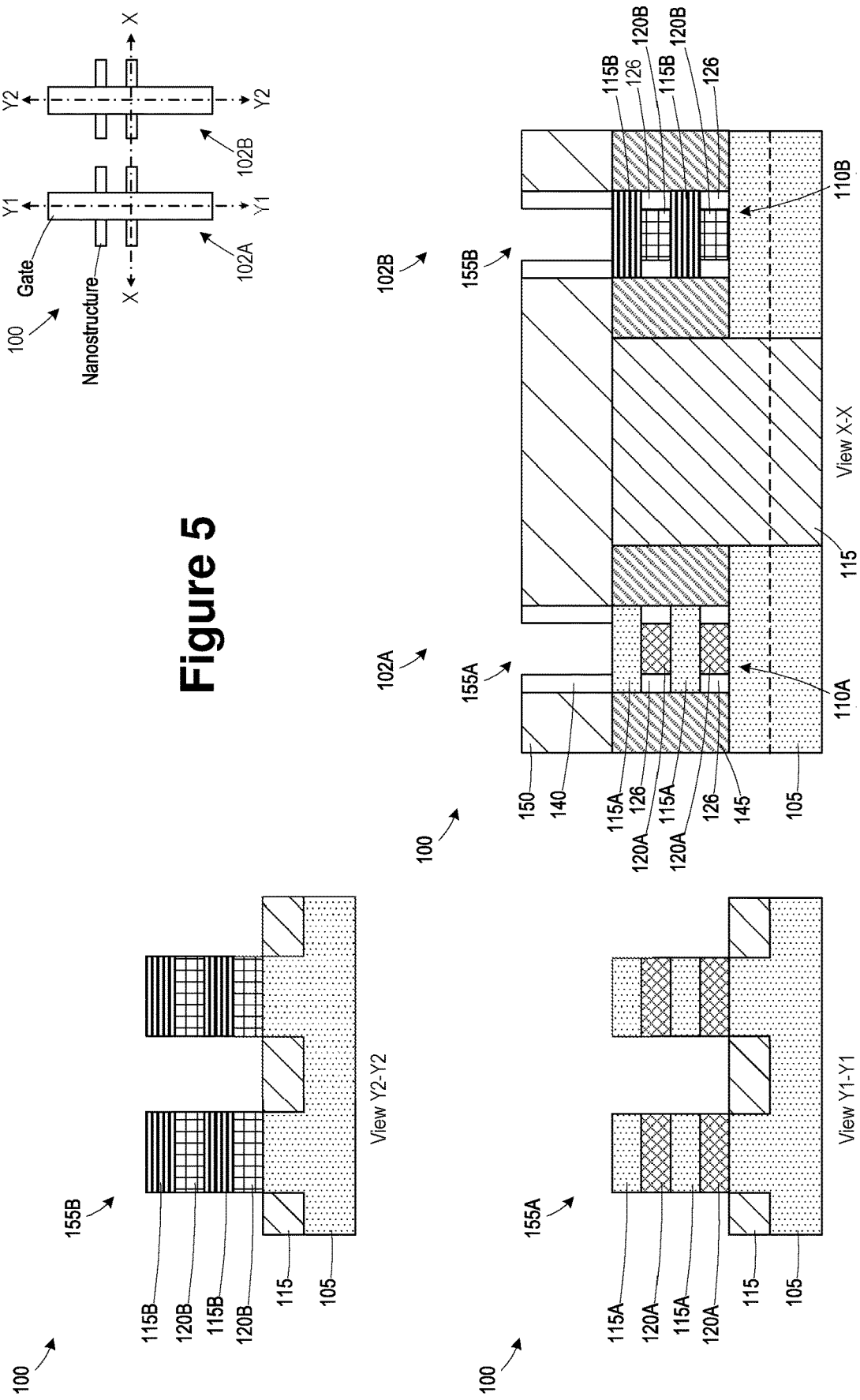

Referring to FIG. 5, the sacrificial gate electrodes 130 and the first gate dielectric layer 125 are removed to define gate cavities 155A, 155B and expose portions of the fins 110A, 110B, in accordance with some embodiments. In some embodiments, an etch process is performed to remove the first gate dielectric layer 125 and the sacrificial gate electrodes 130. In some embodiments, the etch process is a wet etch process selective to the material of the sacrificial gate electrodes 130 and the material of the first gate dielectric layer 125.

Figure 6:
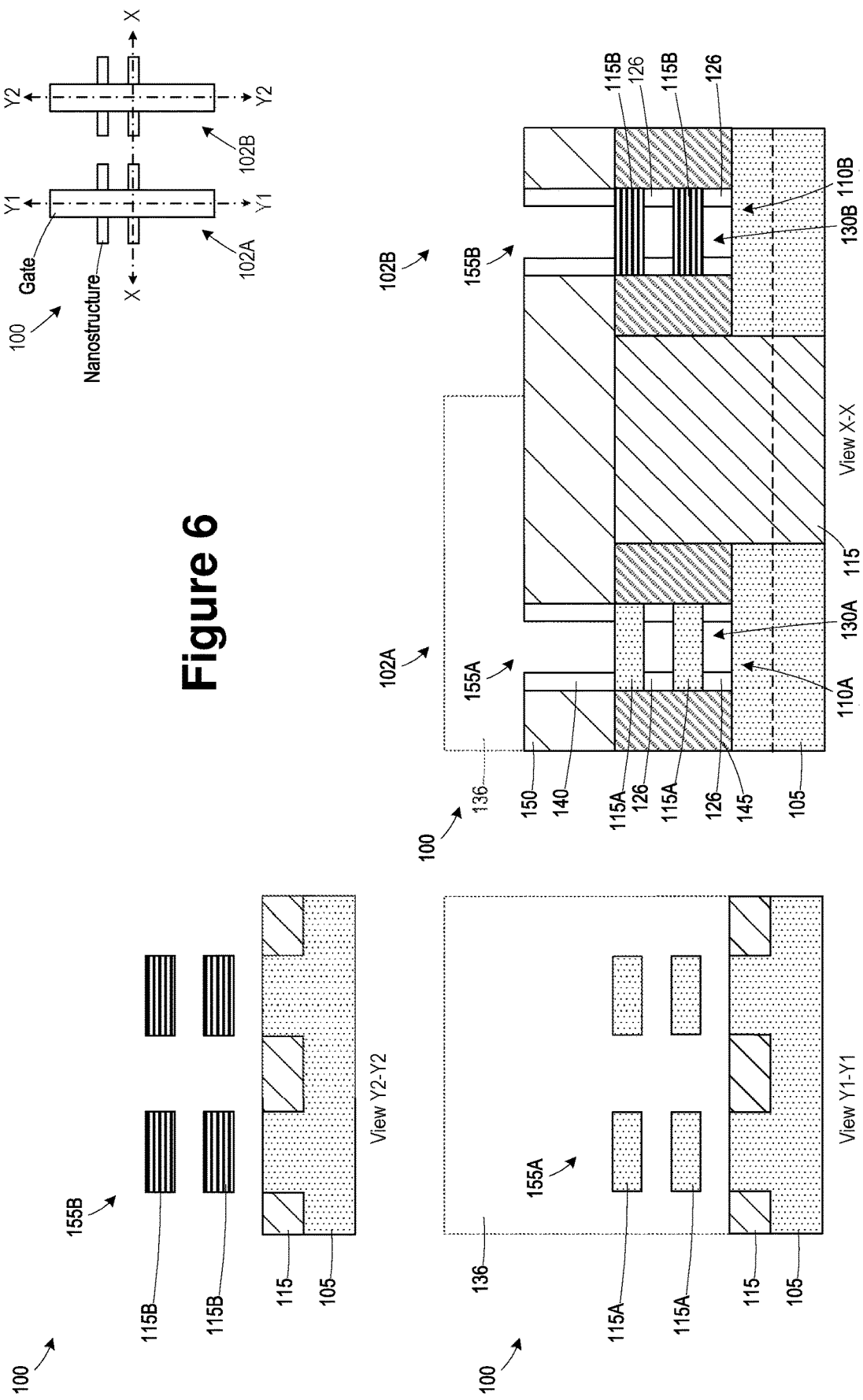

Referring to FIG. 6, the sacrificial semiconductor layers 120A, 120B are removed to define intermediate cavities 130A, 130B between the semiconductor material layers 115A, 115B, in accordance with some embodiments. In some embodiments, an etch process is performed to remove the sacrificial semiconductor layers 120A, 120B. In some embodiments, where the sacrificial semiconductor layers 120A, 120B comprise the same material composition, a concurrent etch process is performed to remove the sacrificial semiconductor layers 120A, 120B. In some embodiments, where the sacrificial semiconductor layers 120A, 120B comprises different material compositions, separate etch processes are used in the presence of masks, such as using a mask layer 136 to remove at least some of the sacrificial semiconductor layers 120A, 120B. For example, the mask layer 136 masks the first gate cavity 155A to allow selective removal of the sacrificial semiconductor layer 120B. In some embodiments, an additional mask layer is used to mask the second gate cavity 155B and the intermediate cavity 130B to allow selective removal of the sacrificial semiconductor layer 120A after the removal of the sacrificial semiconductor layer 120B.

Figure 7:
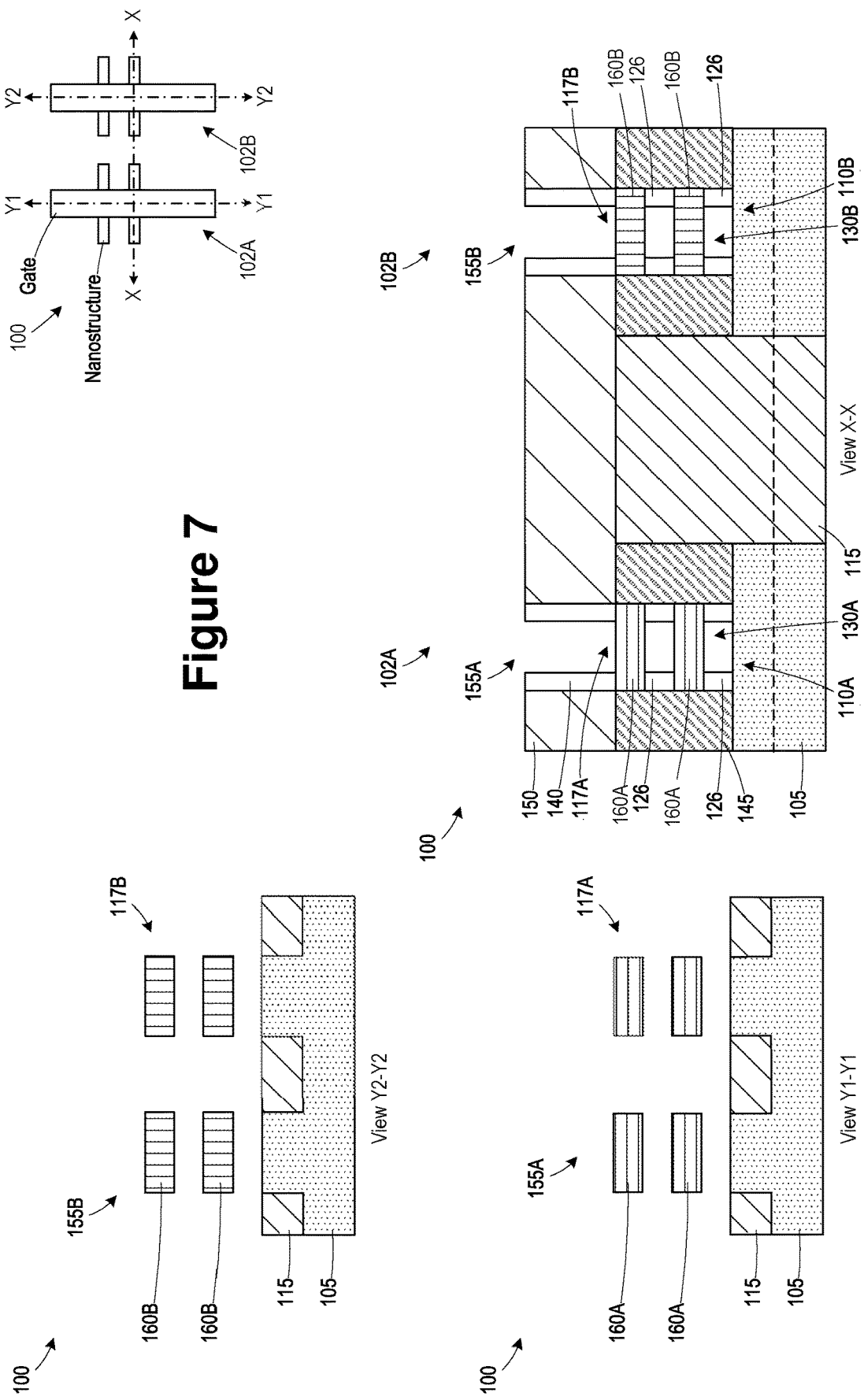

Referring to FIG. 7, doped regions 160A, 160B are formed in channel regions 117A, 117B of the semiconductor material layers 115A, 115B exposed by the gate cavities 155A, 155B, in accordance with some embodiments. As described in greater detail below with respect to FIGS. 8A-8D, in some embodiments, the diffusion process comprises a solid phase diffusion (SPD) process employing sacrificial layers comprising dopants to form the doped regions 160A, 160B. In some embodiments, during the SPD process, an anneal process is performed to diffuse dopant from the sacrificial layers into the semiconductor material layers 115A, 115B. As described in greater detail below with respect to FIGS. 9A-9B, in some embodiments, the diffusion process uses plasma assisted diffusion to form the doped regions 160A, 160B. In some embodiments, the doped regions 160A and 160B comprise dopants of different dopant-types. For example, one of the first doped region 160A or the second doped region 160B comprises p-type dopants, such as boron, $BF_2$, or other suitable p-type dopant, and the other of the doped regions 160A, 160B comprises n-type dopants, such as phosphorous, arsenic, or other suitable n-type dopant.

Figure 8D:
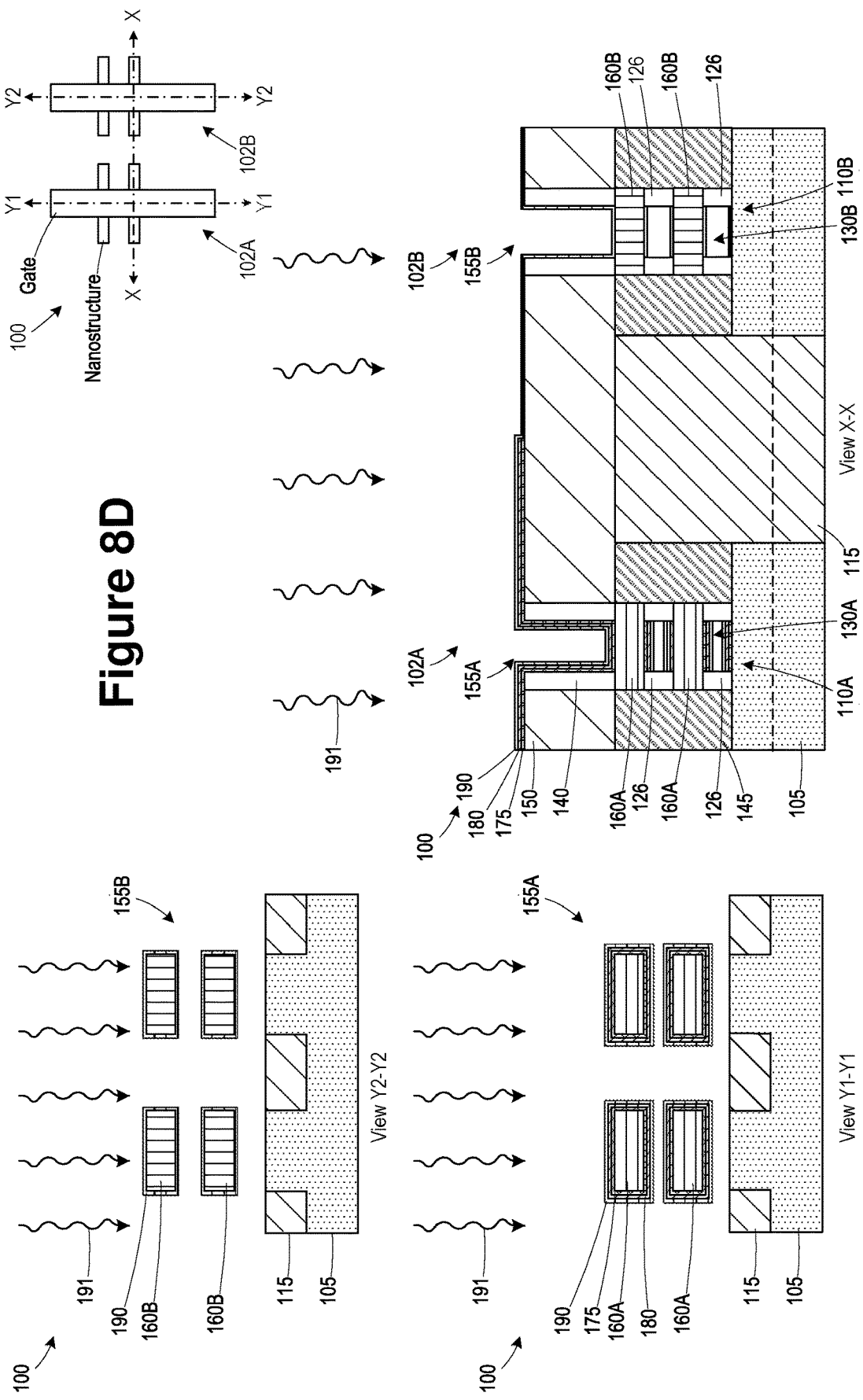

Referring to FIGS. 8A-8D, a diffusion process is performed using sacrificial layers comprising dopants to form the doped regions 160A, 160B shown in FIG. 7, in accordance with some embodiments. Referring to FIG. 8A, a first doped layer 175 is formed over the semiconductor material layers 115A, 115B in the gate cavities 155A, 155B and over the dielectric layer 150, and a cap layer 180 is formed over the first doped layer 175, in accordance with some embodiments.

In some embodiments, the cap layer 180 has a thickness ranging from about 5 angstroms to about 30 angstrom. In some embodiments, the thickness of the cap layer 180 is selected based upon at least one of properties of a subsequently formed second doped layer 190 (illustrated in FIG. 8C), such as drive-in characteristics of the second doped layer 190, or properties of a subsequent anneal process (described with respect to FIG. 8D), such as temperature during the anneal process, duration of the anneal process, etc. In some embodiments, the thickness of the cap layer 180 is selected to be sufficiently thick to mitigate or prevent dopants in the second doped layer 190 from being driven into the first doped layer 175 or underlying semiconductor material layer 115A according to the processes described with respect to FIGS. 8B-8D.

In some embodiments, such as where the first doped region 160A is to comprise p-type dopants, the first doped layer 175 comprises borosilicate glass (BSG) or other suitable p-type material. In some embodiments, such as where the first doped region 160A is to comprise n-type dopants, the first doped layer 175 comprises phosphosilicate glass (PSG) or other suitable n-type material. In some embodiments, the first doped layer 175 is formed using a CVD process, a LPCVD process, an ALD process, or some other suitable deposition process. In some embodiments, the cap layer 180 is formed using a CVD process, a LPCVD process, an ALD process, or another suitable deposition process. In some embodiments, native oxide may form on the semiconductor material layers 115A, 115B prior to the first doped layer 175 being formed. In some such embodiments, an in situ cleaning process is performed to remove the native oxide formed over the semiconductor material layers 115A, 115B prior to forming the first doped layer 175, and a plasma enhanced ALD (PEALD) process is performed after the cleaning process to form the first doped layer 175 over the semiconductor material layers 115A, 115B.

Referring to FIG. 8B, a patterned mask layer 185 is formed in the first gate cavity 155A in the first region 102A and the first doped layer 175 and the cap layer 180 are removed from the second gate cavity 155B, in accordance with some embodiments. The patterned mask layer 185 exposes the sidewall spacer 140 and the semiconductor material layer 115B that define the second gate cavity 155B in the second region 102B. In some embodiments, the patterned mask layer 185 comprises photoresist. In some embodiments, one or more etch processes are performed to remove the first doped layer 175 and the cap layer 180.

Referring to FIG. 8C, the patterned mask layer 185 is removed and a second doped layer 190 is formed over the cap layer 180 in the first gate cavity 155A and over the semiconductor material layer 115B in the second gate cavity 155B, in accordance with some embodiments. In some embodiments, such as where the second doped region 160B is to comprise n-type dopants, the second doped layer 190 comprises phosphosilicate glass (PSG) or other suitable n-type material. In some embodiments, such as where the second doped region 160B is to comprise p-type dopants, the second doped layer 190 comprises borosilicate glass (BSG) or other suitable p-type material. In some embodiments, the second doped layer 190 is formed using a CVD process, a LPCVD process, an ALD process, or another suitable deposition process. In some embodiments, native oxide may form on the semiconductor material layer 115B after the first doped layer 175 and the cap layer 180 are removed from the second gate cavity 155B to expose the semiconductor material layer 115B. In some such embodiments, prior to the second doped layer 190 being formed, an in situ cleaning process is performed to remove the native oxide over the semiconductor material layer 115B, and a PEALD process is performed after the cleaning process to form the second doped layer 190.

Referring to FIG. 8D, an anneal process 191 is performed, in accordance with some embodiments. In some embodiments, during the anneal process, dopant from the first doped layer 175 in the first gate cavity 155A diffuses into the semiconductor material layer 115A to form the first doped region 160A and dopant from the second doped layer 190 in the second gate cavity 155B diffuses into the semiconductor material layer 115B to form the second doped region 160B. In some embodiments, the anneal process 191 is performed at a temperature ranging from about 400-1100° C. In some embodiments, the anneal process 191 is performed at a temperature ranging from about 500-1000° C. In some embodiments, after the anneal process 191, remaining portions of the first doped layer 175, the cap layer 180, and the second doped layer 190 are removed to expose the first doped region 160A and the second doped region 160B. In some embodiments, an etch process is performed to remove the first doped layer 175, the cap layer 180, and the second doped layer 190. In some embodiments, the etch process is a wet etch process selective to the material of the first doped layer 175, the cap layer 180, and the second doped layer 190.

In some embodiments, the anneal process 191 is a spike anneal process or a soak anneal process. In some embodiments, the anneal process 191 is a 5 second soak anneal process or a 10 second soak anneal process. In some embodiments, parameters of the anneal process 191 are determined as a function of a desired dopant concentration in the channel region, where threshold voltages of the resulting transistors are a function of the dopant concentration in the channel region. In some embodiments, the dopant concentration for adjusting threshold voltage is less than a concentration for forming source/drain regions or lightly doped extension regions. In some embodiments, the dopant concentration is between about $1 \times 10^{16}$ dopants/cm$^3$ to about $1 \times 10^{19}$ dopants/cm$^3$. In some embodiments, the anneal temperature and soak time affect the diffusion concentration and uniformity. In some embodiments, a low dopant concentration, such as a dopant concentration of about $1 \times 10^{16}$ dopants/cm$^3$ allows a lower temperature anneal process to be used, thereby mitigating the likelihood of thermal induced defects in the semiconductor arrangement 100.

Figure 8F:
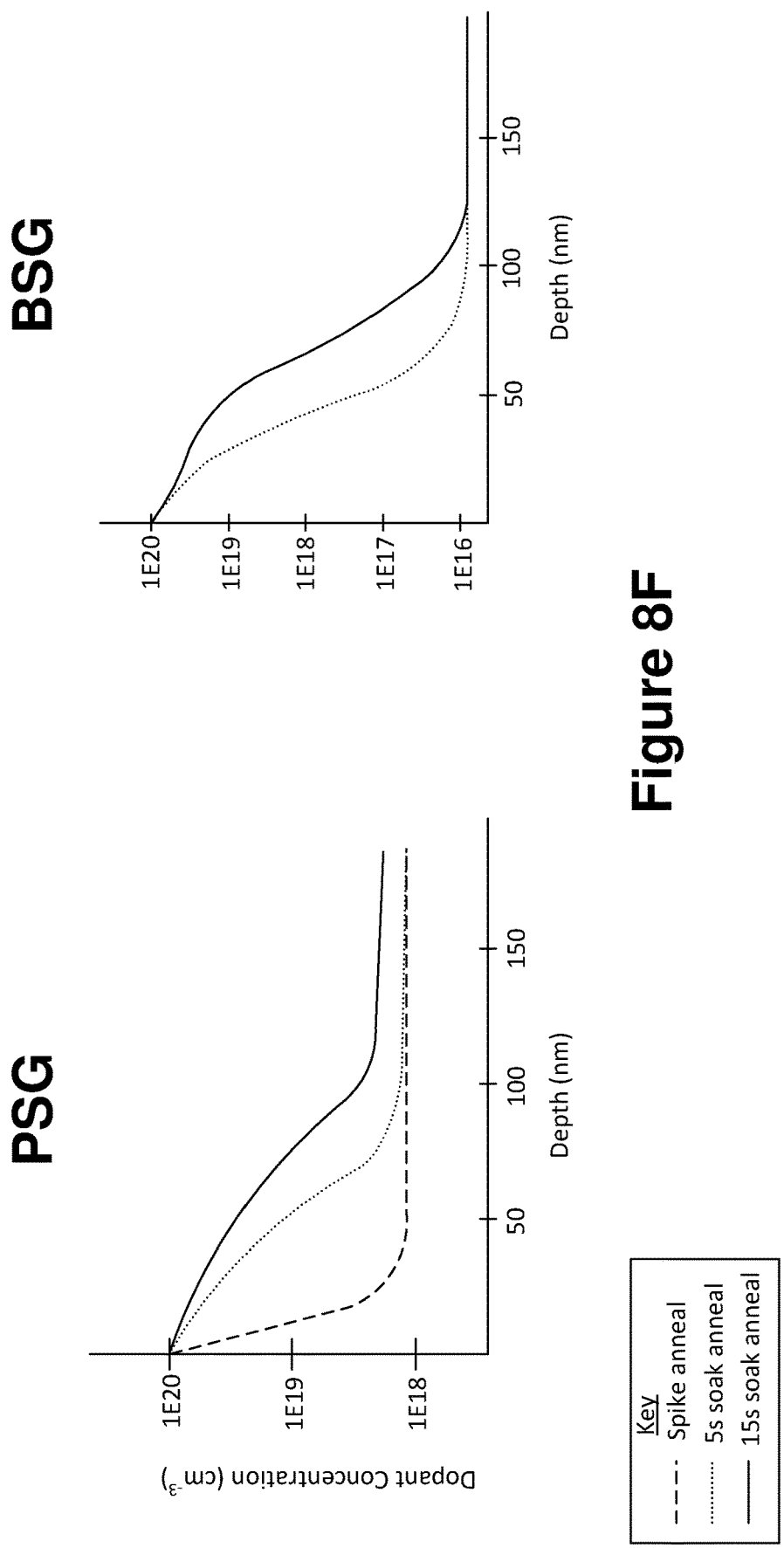

Referring to FIGS. 8E and 8F, example curves are provided showing the dopant concentration as a function of depth before and after solid phase diffusion annealing process (i.e., before and after the anneal process 191 described with respect to FIG. 8D), in accordance with some embodiments. In some embodiments, one of the first doped layer 175 or the second doped layer 190 comprises PSG and the other of the first doped layer 175 or the second doped layer 190 comprises BSG.

Referring to FIG. 8E, curves illustrating dopant concentration as a function of depth prior to a solid phase diffusion annealing process are shown, in accordance with some embodiments. In some embodiments, as illustrated by the curves, dopant concentrations within the first doped layer 175 and the second doped layer 190 vary by depth. For example, in some embodiments, the dopant concentrations are greatest near middle or center regions of the first doped layer 175 and the second doped layer 190 and generally decrease from the center regions of the first doped layer 175 and the second doped layer 190 toward the edges or edge regions of the first doped layer 175 and the second doped layer 190 facing toward the semiconductor material layers 115A, 115B and facing away from the semiconductor material layers 115A, 115B. In some embodiments, a ratio of dopants at center regions of the first doped layer 175 and the second doped layer 190 to dopants at edge regions of the first doped layer 175 and the second doped layer 190 is between about 1000 and about 10000.

Referring to FIG. 8F, curves illustrating dopant concentration as a function of depth after a solid phase diffusion annealing process and after the first doped layer 175, the cap layer 180, and the second doped layer 190 have been removed are shown, in accordance with some embodiments. In some embodiments, dopant from the first doped layer 175 diffuses into the first doped region 160A and dopant from the second doped layer 190 diffuses into the second doped region 160B. In some embodiments, as illustrated, the dopant concentrations are greatest near edges or edge regions of the first doped region 160A and the second doped region 160B and generally decrease from the edge regions of the first doped region 160A and the second doped region 160B toward the middle or center regions the first doped region 160A and the second doped region 160B. In some embodiments, a ratio of dopants at the center regions of the first doped region 160A and the second doped region 160B to dopants at edge regions of the first doped region 160A and the second doped region 160B decreases as a thicknesses of the first doped region 160A and the first doped region 160A increase. For example, when the thickness of the semiconductor material layer 115A, which becomes the first doped region 160A, is 75 nm and the first doped layer 175 comprises PSG, a ratio of the dopants at a center region of the first doped region 160A to dopants at an edge region of the first doped region 160A may be about 0.1 and when the thickness of the semiconductor material layer 115A, which becomes the first doped region 160A, is 125 nm and the first doped layer 175 comprises PSG, a ratio of the dopants at a center region of the first doped region 160A to dopants at an edge region of the first doped region 160A may be about 0.01.

In some embodiments, a concentration of dopants at a given depth within the first doped layer 175 and the second doped layer 190 is a function of the anneal process 191. For example, at a given depth, the concentration of dopant may be less when the anneal process 191 is a spike anneal process than when the anneal process 191 is a 5 second soak anneal process, and the concentration of dopant may be less when the anneal process 191 is a 5 second soak anneal process than when the anneal process 191 is a 15 second soak anneal process. In some embodiments, at depths that are greater than a certain value, such as 125 nm, the dopant concentration is about the same regardless of whether the anneal process 191 is a spike anneal process, a 5 second soak anneal process, or a 15 second soak anneal process.

In some embodiments, the cap layer 180 mitigates out-diffusion of the dopant from the first doped layer 175 and inhibits diffusion of the dopant from the second doped layer 190 in the first gate cavity 155A into the semiconductor material layers 115A. In some embodiments, the cap layer 180 is omitted. For example, in some embodiments, an anneal time of the anneal process 191 is less than the time it takes for dopants from the second doped layer 190 in the first gate cavity 155A to diffuse into the semiconductor material layers 115A, and thus the cap layer 180 is omitted. For example, in some embodiments, due to the thickness of the first doped layer 175 and the anneal time of the anneal process 191, there is insufficient time for the dopants in the second doped layer 190 in the first gate cavity 155A to diffuse into the semiconductor material layers 115A, and thus the cap layer 180 is omitted.

In some embodiments, during the removal of the remaining portions of the first doped layer 175, the cap layer 180, and the second doped layer 190 after the anneal process 191 is complete, more of the doped region 160B is etched than the doped region 160A because the doped region 160B is merely surrounded by the second doped layer 190 whereas the doped region 160A is surrounded by the second doped layer 190, the cap layer 180, and the first doped layer 175. As a result, in some embodiments, at least one of a thickness or a width of the doped region 160B is less than at least one of a thickness or a width of the doped region 160A. In some embodiments, the thickness (measured vertically on the page) of the doped region 160B is about 1 angstrom to about 40 angstroms less than the thickness of the doped region 160A. In some embodiments, the width (measured horizontally on the page) of the doped region 160B is about 1 angstrom to about 40 angstroms less than the width of the doped region 160A.

Figure 9A:
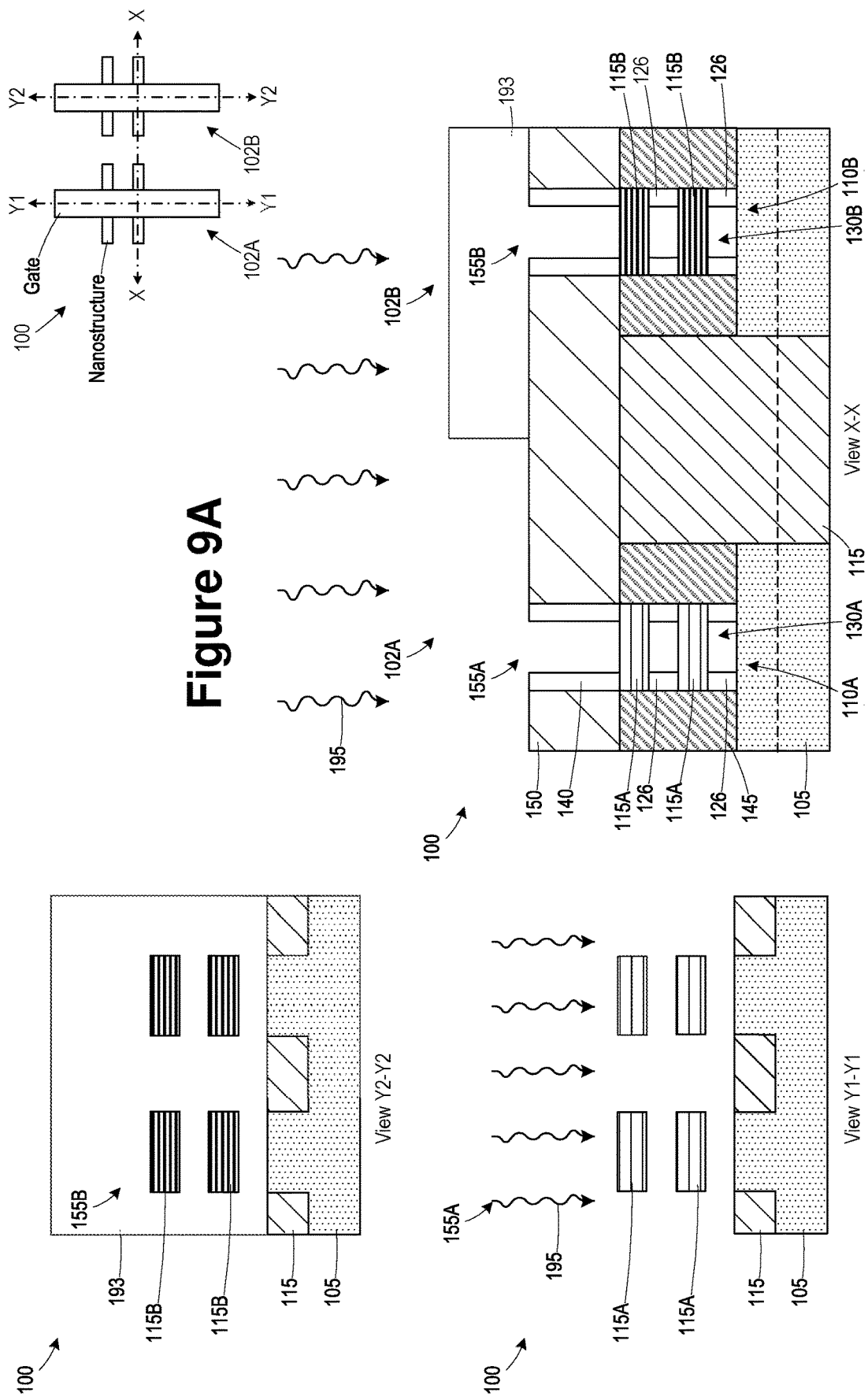
FIGS. 9A-9B, 10, and 11 are illustrations of a semiconductor arrangement at various stages of fabrication, in accordance with some embodiments.
Figure 9B:
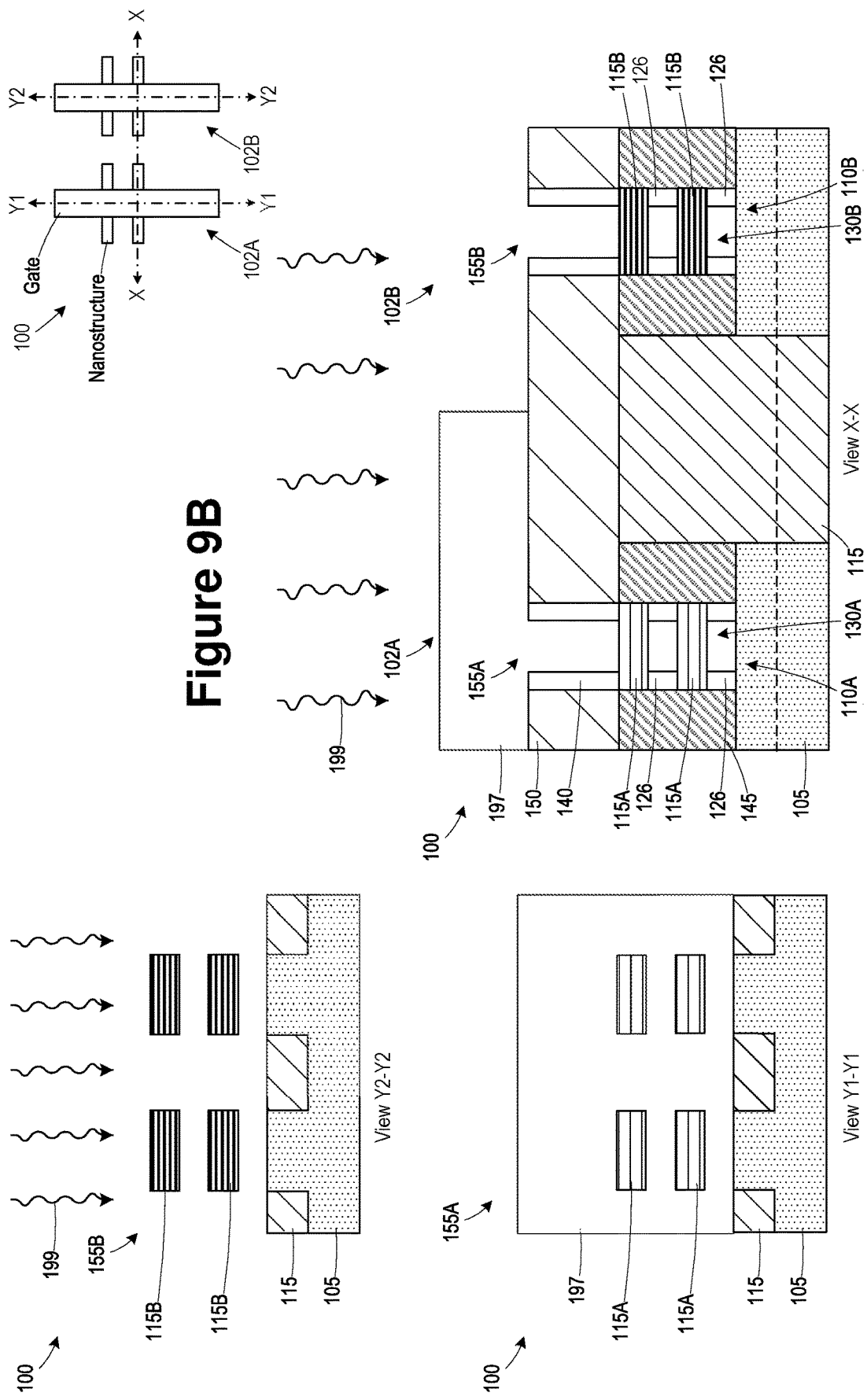

Referring to FIGS. 9A-9B a diffusion process is performed using plasma assisted diffusion to define the doped regions 160A, 160B shown in FIG. 15, in accordance with some embodiments. Referring to FIG. 9A, a patterned mask layer 193 is formed in the second gate cavity 155B in the second region 102B and a first plasma assisted diffusion process 195 is performed, in accordance with some embodiments. In some embodiments, the plasma assisted diffusion process 195 is performed using a first precursor gas comprising a first dopant, and the first dopant diffuses into semiconductor material layers 115A in the first gate cavity 155A to form the first doped region 160A. In some embodiments, such as where the first doped region 160A is to comprise n-type dopants, the precursor gas comprises $AsH_3$. In some embodiments, such as where the first doped region 160A is to comprise p-type dopants, the precursor gas comprises $B_2H_6$.

Referring to FIG. 9B, the patterned mask layer 193 is removed, a patterned mask layer 197 is formed in the first gate cavity 155A in the first region 102A and a second plasma assisted diffusion process 199 is performed, in accordance with some embodiments. In some embodiments, the plasma assisted diffusion process 199 is performed using a second precursor gas comprising a second dopant, and the second dopant diffuses into semiconductor material layers 115B in the second gate cavity 155B to form the second doped region 160B. In some embodiments, the second precursor gas is different than the first precursor gas. In some embodiments, the first precursor gas comprises one or an n-type dopant or a p-type dopant and the second precursor gas comprises the other of the n-type dopant or the p-type dopant. In some embodiments, such as where the second doped region 160B is to comprise n-type dopants the second precursor gas comprises $AsH_3$ for an n-type dopant. In some embodiments, such as where the second doped region 160B is to comprise p-type dopants, the second precursor gas comprises $B_2H_6$.

Figure 10:
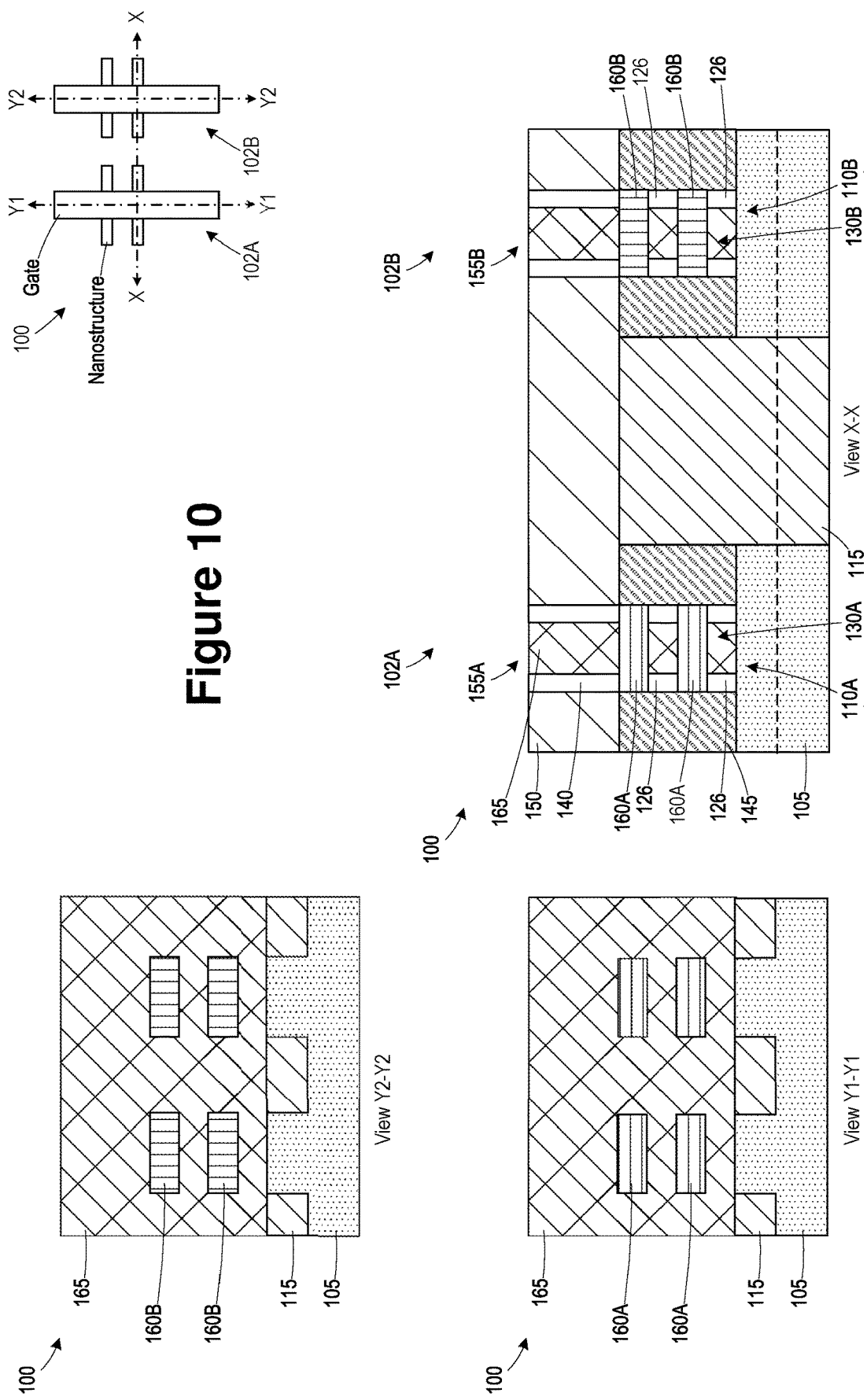

Referring to FIG. 10, gate structures 165 are formed in the gate cavities 155A, 155B, in accordance with some embodiments. In some embodiments, the gate structures 165 comprises a gate dielectric layer, a gate electrode layer, and other suitable layers. In some embodiments, the gate dielectric layer comprises a high-k dielectric material. In some embodiments, the gate electrode layer comprises a metal fill layer. In some embodiments, the metal fill layer comprises tungsten (W) or other suitable material. The gate dielectric layer, gate electrode layer, and other suitable layers of the gate structures 165 may be deposited by at least one of ALD, PVD, CVD, or other suitable processes. According to some embodiments, a planarization process is performed to remove portions of the material forming the gate structures 165 positioned over the dielectric layer 150.

Figure 11:
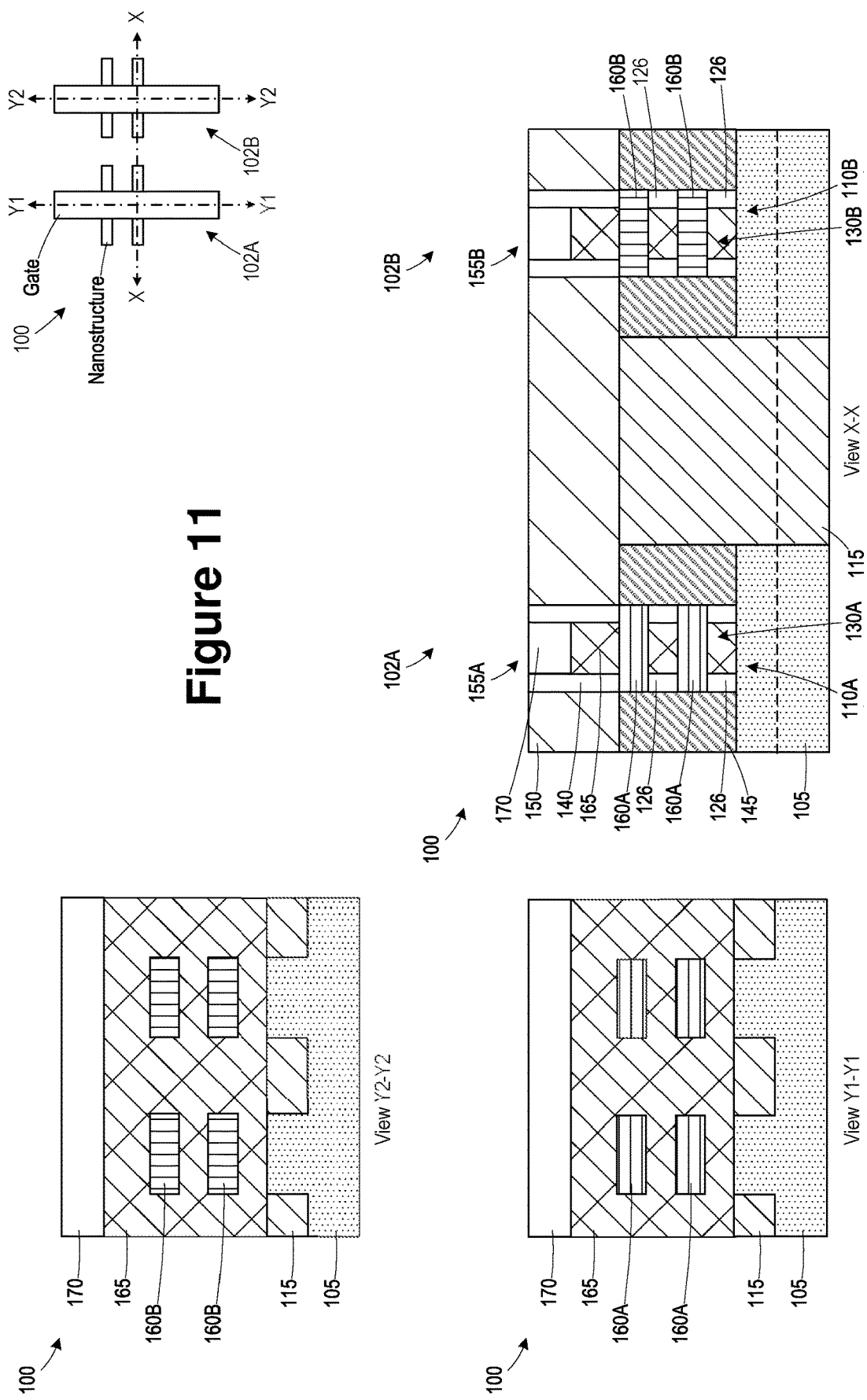

Referring to FIG. 11, the gate structures 165 are recessed and cap layers 170 are formed over the gate structures 165, in accordance with some embodiments. In some embodiments, the gate structures 165 are recessed using an etch process. In some embodiments, the cap layers 170 are formed using a deposition process. In some embodiments, the cap layers 170 comprise dielectric materials. In some embodiments, the cap layers 170 comprise silicon and nitrogen, silicon and oxygen, or other suitable materials.

Forming the doped regions 160A, 160B using diffusion improves the uniformity of the doping compared to implantation-based doping. Diffusion processes also reduce damage to the channel semiconductor material. The use of the doped layers 175, 190 provides enhanced conformality in high aspect ratio gate cavities. In some embodiments, the doped regions 160A, 160B allow separate control of threshold voltage for the respective transistors without the need to employ work function material layers in the gate structures.

In some embodiments, a method for forming a semiconductor arrangement includes forming a first fin over a semiconductor layer. A first sacrificial gate structure is formed over a first portion of the first fin. A first sidewall spacer is formed adjacent the first sacrificial gate structure. The first sacrificial gate structure is removed to form a first gate cavity defined by the first sidewall spacer. A first diffusion process is performed to form a first doped region comprising a first dopant in a second portion of the first fin exposed in the first gate cavity. A first gate structure is formed in the first gate cavity over the first doped region.

In some embodiments, a method for forming a semiconductor arrangement includes forming a first fin including a first semiconductor material layer, a second semiconductor material layer over the first semiconductor material layer, and a third semiconductor material layer over the second semiconductor material layer. A first sacrificial gate structure is formed over a first portion of the first fin. A first sidewall spacer is formed adjacent the first sacrificial gate structure. The first sacrificial gate structure is removed to form a first gate cavity in the dielectric layer and to expose a portion of the second semiconductor material layer. The portion of the second semiconductor material layer is removed to define a first intermediate cavity between a second portion of the first semiconductor material layer and a second portion of the third semiconductor material layer. A first diffusion process is performed to form a first doped region comprising a first dopant in the second portion of the first semiconductor material layer and to form a second doped region in the second portion of the third semiconductor material layer. A first gate structure is formed in the first gate cavity.

In some embodiments, a method for forming a semiconductor arrangement includes forming a fin. A first layer comprising a first dopant is formed over a channel region of the fin. An anneal process is performed to diffuse a portion of the first dopant into the channel region of the fin. The first layer is removed. A first gate structure is formed over the channel region of the fin after removing the first layer.

The foregoing outlines features of several embodiments so that those of ordinary skill in the art may better understand various aspects of the present disclosure. Those of ordinary skill in the art should appreciate that they may readily use the present disclosure as a basis for designing or modifying other processes and structures for carrying out the same purposes and/or achieving the same advantages of various embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing at least some of the claims.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers, regions, features, elements, etc. mentioned herein, such as at least one of etching techniques, planarization techniques, implanting techniques, doping techniques, spin-on techniques, sputtering techniques, growth techniques, or deposition techniques such as chemical vapor deposition (CVD), for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others of ordinary skill in the art based upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A method for forming a semiconductor arrangement, comprising:
    forming a first fin over a semiconductor layer;
    forming a second fin over the semiconductor layer;
    forming a first sacrificial gate structure over a first portion of the first fin;
    forming a second sacrificial gate structure over a first portion of the second fin;
    forming a first sidewall spacer adjacent the first sacrificial gate structure;
    forming a second sidewall spacer adjacent the second sacrificial gate structure;
    removing the first sacrificial gate structure to form a first gate cavity defined by the first sidewall spacer;
    removing the second sacrificial gate structure to form a second gate cavity defined by the second sidewall spacer;
    performing a first diffusion process to form a first doped region comprising a first dopant in a second portion of the first fin exposed in the first gate cavity;
    performing a second diffusion process to form a second doped region comprising a second dopant in a second portion of the second fin exposed in the second gate cavity, wherein performing the first diffusion process and the second diffusion process comprises:
        forming a first layer comprising the first dopant over the second portion of the first fin;
        forming a second layer comprising the second dopant over the second portion of the second fin;
        performing an anneal process to diffuse a portion of the first dopant into the second portion of the first fin and to diffuse a portion of the second dopant into the second portion of the second fin; and
        removing the first layer and the second layer;
    forming a first gate structure in the first gate cavity over the first doped region; and
    forming a second gate structure in the second gate cavity over the second doped region.

2. The method of claim 1, wherein:
    forming the first layer comprises forming the first layer over the second portion of the second fin,
    the method comprises:
        forming a first mask layer over the second portion of the first fin; and performing an etch process to remove the first layer over the second portion of the second fin, and forming the second layer comprises forming the second layer over the second portion of the second fin after performing the etch process to remove the first layer over the second portion of the second fin.

3. The method of claim 1, comprising forming a cap layer over the first layer over the second portion of the first fin, wherein forming the second layer comprises forming the second layer over the cap layer.

4. The method of claim 3, comprising:
   forming the cap layer over the second portion of the second fin;
   forming a second mask layer over the cap layer over second portion of the first fin and in the first gate cavity;
   removing the cap layer over the second portion of the second fin; and
   removing the second mask layer prior to forming the second layer.

5. A method for forming a semiconductor arrangement, comprising:
   forming a first fin over a semiconductor layer;
   forming a second fin over the semiconductor layer;
   forming a first sacrificial gate structure over a first portion of the first fin;
   forming a second sacrificial gate structure over a first portion of the second fin;
   forming a first sidewall spacer adjacent the first sacrificial gate structure;
   forming a second sidewall spacer adjacent the second sacrificial gate structure;
   removing the first sacrificial gate structure to form a first gate cavity defined by the first sidewall spacer;
   removing the second sacrificial gate structure to form a second gate cavity defined by the second sidewall spacer;
   performing a first diffusion process to form a first doped region comprising a first dopant in a second portion of the first fin exposed in the first gate cavity;
   performing a second diffusion process to form a second doped region comprising a second dopant in a second portion of the second fin exposed in the second gate cavity, wherein performing the first diffusion process comprises performing a first plasma assisted diffusion process using a first precursor comprising the first dopant while masking the second portion of the second fin, and performing the second diffusion process comprises performing a second plasma assisted diffusion process using a second precursor comprising the second dopant while masking the second portion of the first fin;
   forming a first gate structure in the first gate cavity over the first doped region; and
   forming a second gate structure in the second gate cavity over the second doped region.

6. The method of claim 5, wherein the first dopant comprises one of a P-type dopant or an N-type dopant, and the second dopant comprises the other of the P-type dopant or the N-type dopant.

7. The method of claim 1, wherein:
   the first fin comprises a first semiconductor material layer and a second semiconductor material layer over the first semiconductor material layer,
   removing the first sacrificial gate structure to define the first gate cavity exposes a portion of the first semiconductor material layer and a portion of the second semiconductor material layer, and the method comprises removing one of the portion of the first semiconductor material layer or the portion of the second semiconductor material layer prior to performing the first diffusion process.

8. A method for forming a semiconductor arrangement, comprising:
   forming a first fin comprising a first semiconductor material layer, a second semiconductor material layer over the first semiconductor material layer, and a third semiconductor material layer over the second semiconductor material layer;
   forming a first sacrificial gate structure over a first portion of the first fin;
   forming a first sidewall spacer adjacent the first sacrificial gate structure;
   removing the first sacrificial gate structure to form a first gate cavity defined by the first sidewall spacer and to expose a portion of the second semiconductor material layer;
   removing the portion of the second semiconductor material layer to define a first intermediate cavity between a second portion of the first semiconductor material layer and a second portion of the third semiconductor material layer;
   performing a first diffusion process to form a first doped region comprising a first dopant in the second portion of the first semiconductor material layer and to form a second doped region in the second portion of the third semiconductor material layer; and
   forming a first gate structure in the first gate cavity.

9. The method of claim 8, wherein performing the first diffusion process comprises:
   forming a first layer comprising the first dopant over the second portion of the first semiconductor material layer and over the second portion of the third semiconductor material layer; and
   performing a first anneal process to diffuse a portion of the first dopant into the second portion of the first semiconductor material layer and into the second portion of the third semiconductor material layer.

10. The method of claim 8, wherein performing the first diffusion process comprises performing a plasma assisted diffusion process using a precursor comprising the first dopant.

11. The method of claim 8, comprising:
    forming a second fin comprising a fourth semiconductor material layer, a fifth semiconductor material layer over the fourth semiconductor material layer, and a sixth semiconductor material layer over the fifth semiconductor material layer;
    forming a second sacrificial gate electrode over a first portion of the second fin;
    forming a second sidewall spacer adjacent the second sacrificial gate electrode;
    removing the second sacrificial gate electrode to form a second gate cavity defined by the second sidewall spacer and to expose a portion of the fifth semiconductor material layer;
    removing the portion of the fifth semiconductor material layer to define a second intermediate cavity between a second portion of the fourth semiconductor material layer and a second portion of the sixth semiconductor material layer;
    performing a second diffusion process to form a third doped region comprising a second dopant in the second portion of the fourth semiconductor material layer and to form a fourth doped region in the second portion of the sixth semiconductor material layer;
forming a first gate structure in the first gate cavity; and
forming a second gate structure in the second gate cavity.

12. The method of claim 11, wherein performing the first diffusion process and the second diffusion process comprises:
forming a first layer comprising the first dopant over the second portion of the first semiconductor material layer and over the second portion of the third semiconductor material layer;
forming a second layer comprising the second dopant over the second portion of the fourth semiconductor material layer and over the second portion of the sixth semiconductor material layer;
performing an anneal process to diffuse a portion of the first dopant into the second portion of the first semiconductor material layer and over the second portion of the third semiconductor material layer and to diffuse a portion of the second dopant into the second portion of the fourth semiconductor material layer and into the second portion of the sixth semiconductor material layer; and
removing the first layer and the second layer.

13. The method of claim 11, wherein the first dopant comprises one of a P-type dopant or an N-type dopant, and the second dopant comprises the other of the P-type dopant or the N-type dopant.

14. The method of claim 1, wherein the first dopant comprises one of a P-type dopant or an N-type dopant, and the second dopant comprises the other of the P-type dopant or the N-type dopant.

15. The method of claim 5, wherein:
the first fin comprises a first semiconductor material layer and a second semiconductor material layer over the first semiconductor material layer,
removing the first sacrificial gate structure to define the first gate cavity exposes a portion of the first semiconductor material layer and a portion of the second semiconductor material layer, and
the method comprises removing one of the portion of the first semiconductor material layer or the portion of the second semiconductor material layer prior to performing the first diffusion process.

16. The method of claim 5, wherein a precursor gas comprises $AsH_3$.

17. The method of claim 5, wherein a precursor gas comprises $B_2H_6$.

18. The method of claim 5, wherein the first gate structure and the second gate structure comprise tungsten over a gate dielectric layer.

19. The method of claim 1, wherein the first layer comprises borosilicate glass.

20. The method of claim 1, wherein the second layer comprises phosphosilicate glass.

* * * * *